(12) United States Patent
Ohshima et al.

(10) Patent No.: US 6,332,833 B1
(45) Date of Patent: Dec. 25, 2001

(54) METHOD FOR FABRICATING SILICON SEMICONDUCTOR DISCRETE WAFER

(75) Inventors: Hisashi Ohshima; Tsutomu Satoh, both of Niigata-ken (JP)

(73) Assignee: Naoetsu Electronics Company, Niigata-ken (JP)

( * ) Notice: Subject to any disclaimer, the term of this patent is extended or adjusted under 35 U.S.C. 154(b) by 0 days.

(21) Appl. No.: 09/442,462

(22) Filed: Nov. 18, 1999

Related U.S. Application Data

(62) Division of application No. 08/898,550, filed on Jul. 22, 1997, now Pat. No. 6,066,562.

(30) Foreign Application Priority Data

Aug. 8, 1996 (JP) .................................................. 8-209469

(51) Int. Cl.⁷ .................................................. B24B 53/00
(52) U.S. Cl. ........................... 451/56; 125/11.01; 451/40
(58) Field of Search .............................. 451/56, 40, 443, 451/72; 125/2, 11.01

(56) References Cited

U.S. PATENT DOCUMENTS

| | | | |
|---|---|---|---|
| 1,413,060 | * 4/1922 | Roberts | .................................. 451/40 |
| 4,027,648 | 6/1977 | Bonnice . | |
| 5,024,867 | 6/1991 | Iwabuchi . | |
| 5,240,882 | 8/1993 | Satoh et al. . | |
| 5,360,509 | 11/1994 | Zakaluk et al. . | |
| 5,429,711 | 7/1995 | Watanabe et al. . | |
| 5,472,909 | 12/1995 | Akatsuka et al. . | |
| 5,788,561 | 8/1998 | Pearlman et al. . | |
| 5,851,924 | 12/1998 | Nakazawa et al. . | |

FOREIGN PATENT DOCUMENTS

| | | | |
|---|---|---|---|
| 0074571 | * 4/1987 | (JP) | ................................... 125/11.01 |
| 0003772 | * 1/1991 | (JP) | ........................................ 125/2 |
| 404256575 | * 9/1992 | (JP) | ................................... 125/11.01 |
| 405253838 | * 10/1993 | (JP) | ................................... 125/11.01 |
| 8-316180 | 11/1996 | (JP) . | |

* cited by examiner

Primary Examiner—Robert A. Rose
(74) Attorney, Agent, or Firm—Greenblum & Bernstein, P.L.C.

(57) ABSTRACT

A method of fabricating a silicon semiconductor discrete wafer while dressing the grinding wheel is disclosed that assures excellent finishing accuracy and productivity. The dressing of the grinding wheel includes mixing air and grinding water from a surface grinding process including semiconductor chips lapped with abrasive grains having a count of at least #2000 and no more than #6000 and jetting the mixed air and grinding water as minute water drops back onto the surface of the grinding wheel during grinding of a wafer. Both cut surfaces are ground to a predetermined thickness with the dressed grinding wheel (via a surface grinding machine). The processing surface is wet-etched as the final processing.

16 Claims, 2 Drawing Sheets

METHOD FOR FABRICATING SILICON SEMICONDUCTOR DISCRETE WAFER

This is a division of U.S. patent application Ser. No. 08/898,550, filed Jul. 22, 1997, now U.S. Pat. No. 6,066,562, the contents of which are expressly incorporated by reference herein in its entirety.

BACKGROUND OF THE INVENTION

1. Field of the Invention

The present invention relates to a method of fabricating a silicon semiconductor discrete wafer of the double-layer structure having the impurity diffused layer and the impurity non-diffused layer which is used as a discrete (discrete element) of the transistor, diode, thyristor or the like.

2. Discussion of Background Information

In one method of fabricating a discrete wafer which has been put into a practical use, impurity diffused layers are formed on both surfaces of a wafer at a predetermined thickness under a predetermined temperature and atmosphere. Thereafter one diffused layer is removed by a grinding process from one surface of the wafer and the exposed surface of the impurity non-diffused layer at the center is finally polished as the mirror surface. In another recently introduced method with an aim toward reducing the amount of raw materials, an impurity diffused layer is formed on both surfaces of a wafer that is two times thicker than a desired wafer thickness considering a series of fabrication processes. The wafer is then cut into two pieces at the center of the thickness. The cutting surfaces are then ground and finally polished as the mirror surfaces. Moreover, the cutting process is classified into a single wafer process in which wafers are supplied, cut and retrieved one by one by means of an ID saw slicing machine and a process in which a wafer is sequentially cut from a laminated body formed by many wafers which are laminated and bonded or many wafers are cut at a time from the laminated body with a wire saw or the like. In addition, final polishing to a mirror surface is performed in the following sequence. Namely, a wafer and a glass plate are washed, and the wafer is adhered to the glass plate using a wax under a heated and pressurized condition in a vacuum atmosphere. Thereafter, the wafer surface is polished with a pressurized abrasive cloth using an ultra-fine powder abrasive agent. The wafer is then separated from the glass plate and the wax remaining on the wafer surface is removed by rinsing with a solvent.

The silicon semiconductor wafer can be classified into the IC wafer and discrete wafer depending on the application purposes. Here, the absolute thickness and its accuracy required for the wafer will be described. In the case of the IC wafer, since the working area is limited to the extreme surface, cleanliness, flatness and roughness, etc. of the surface are becoming more important as the integration density is increasingly improved; however, thickness of the wafer is considered only for increasing the strength and does not directly participate in improvement of characteristic. In the case of the discrete wafer, on the other hand, when the wafer is completed as an element, its characteristic is determined by the internal structure of the wafer as a whole. Particularly, thickness of the impurity non-diffused layer decisively gives the basic characteristic of the element and if thickness of one impurity diffused layer is constant, the thickness of the impurity non-diffused layer becomes equal to the problem of the total thickness of the wafer, determining the characteristic of the element. The discrete wafer is quite different from the IC wafer in this point. Therefore, improvement of thickness accuracy (deviation from the target thickness, taper in the wafer surface) of the discrete wafer is increasingly required to realize uniform characteristic when the wafer is completed as an element. In regard to this point, it is impossible to cover with the existing method of fabricating a discrete wafer.

The largest reason is that processing is executed only for the single surface in the final grinding for the mirror surface and the wafer is bonded to the glass plate with a wax but since the final thickness of the discrete wafer is extremely thin (about a half of the thickness of the IC wafer) and the wax provided between the wafer and glass plate will directly influence the quality of wafer such as thickness, waving or recess due to existence of foreign matter, the very high thickness accuracy obtained by the grinding with the current surface grinding machine may be rather deteriorated by the final grinding to the mirror surface. Moreover, a series of processes in relation to the final grinding for mirror surface requires a longer time which has been a large barrier for reduction of fabrication cost.

An object of the present invention is therefore to provide a method of fabricating a semiconductor discrete wafer which assures sufficient final accuracy to cope with the strict requirement in the thickness of the discrete wafer and also assures superiority in the fabrication cost.

SUMMARY OF THE INVENTION

The present invention has solved the problems discussed above by introducing, in place of the existing final grinding to mirror surface using a wax after the grinding process of a wafer, a wet etching process which can directly maintain excellent wafer thickness accuracy after the grinding process and assures excellent productivity.

Namely, a first aspect of the present invention is characterized in the method of fabricating silicon semiconductor discrete wafer of a double-layer structure having an impurity diffused layer at one side of the silicon semiconductor wafer and an impurity non-diffused layer at the other side thereof, wherein a diffused layer where an impurity diffused layer is formed on both sides of a silicon semiconductor wafer or an oxide film is formed on the surface of diffused layer is cut into two pieces at the center of the wafer thickness with an ID saw slicing machine, both cutting surfaces are ground up to the predetermined thickness with a surface grinding machine, both cutting surfaces are lapped with an abrasive grain of the count #2000 or more but #6000 or less and the lapped surfaces are completed by the wet etching. Moreover, a second aspect of the present invention is characterized in the method of fabricating silicon semiconductor discrete wafer of a double-layer structure having an impurity diffused layer at one side of the silicon semiconductor wafer and an impurity non-diffused layer at the other side thereof, wherein a diffused layer where an impurity diffused layer is formed on both sides of a silicon semiconductor wafer or an oxide film is formed on the surface of diffused layer is cut into two pieces at the center of the wafer thickness with an ID saw slicing machine, both cutting surfaces are ground with a grinding wheel with count of #2000 or more but #6000 or less and the ground surfaces are completed by the wet etching.

DETAILED DESCRIPTION OF THE PREFERRED EMBODIMENTS

Figure 1A:
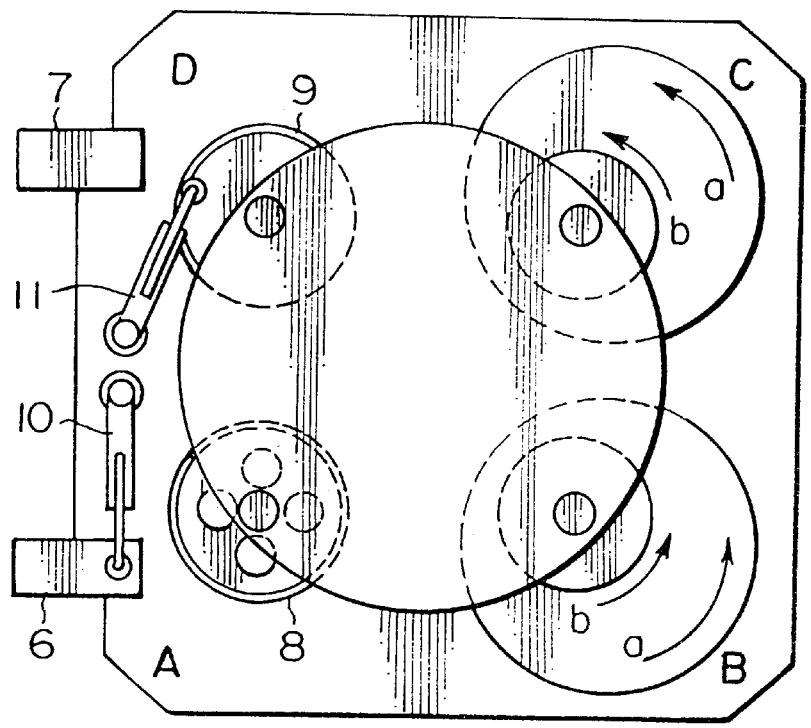
FIG. 1A shows an example of a plan view of the lapping machine used in the present invention.

According to the first aspect of the present invention, a diffused wafer where a diffused layer is formed on both surfaces of the wafer of predetermined thickness being assumed to be cut into two pieces at the center of the thickness of the wafer after impurity diffusion or a diffused wafer under the condition that an oxide film is further formed on such diffused layer so-called to cover the wafer surface with an oxide film is cut into two pieces with an ID slicing machine at the center of wafer thickness, and both cutting surfaces are ground up to the desired thickness with a surface grinding machine. Thereafter, the surface is lapped with the abrasive grain of the count #2000 or more but #6000 or less to remove traces of scratch or grinding distortions generated in the preceding grinding process, and the lapped surface is finally wet etched.

The etching process is a wet etching process (hereinafter referred to only as etching) which assures extremely excellent productivity through direct contact of an etching solution to the wafer.

Here, the wafer as the starting material is a diffused wafer where an oxide film is formed and the entire part of wafer is covered with the oxide film. However, the etching process as the object of the present invention is preferably done only on one surface (non-diffused layer side) and this oxide film is used as the perfect protecting film surface for the etching effect.

Though, this wafer is cut into two pieces at the center of the thickness, it is still covered with the oxide film in the side of the diffused layer and when this wafer is etched in the etching solution, only the lapped surface on which the oxide film is not formed is etched and the diffused surface on which the oxide film is formed is not etched to achieve the object.

Accordingly, the oxide film forming process is required but since the etching process is required only to one surface of the wafer, the discrete wafer having more strict tolerance of thickness can be fabricated.

Slicing of the wafer into two pieces at the center of thickness with the ID saw slicing machine is performed as follows when the wafer is cut from a laminated body. As an example, 100 sheets of wafer are coated with a kind of wax at its single surface, arranged vertically within a conduit type bath and are bonded with pressure while keeping the higher accuracy of right angle from both ends of wafers under the high temperature heating process. These wafers are cooled to form an ingot type laminated body (100 sheets of wafers, for example, are considered to eliminate missing of wafers due to the slicing accuracy and the slicing resistance) and each wafer is sequentially cut at the center of thickness from the first wafer of the ingot with the existing ID saw slicing machine. All wafers are finally collected and the wax used for the bonding of wafers is removed.

The abrasive grain is required to have the count of #2000 or more but #6000 or less. If the count is less than #2000, it is difficult to obtain a good surface after the etching process. If the count exceeds #6000, a good etching surface can certainly be obtained but the grinding process requires a longer time, resulting in a problem that productivity is rapidly deteriorated.

Here, the count means the display count and substantial abrasive grain size can be approximated from the following formula (1).

$$\text{Substantial grain size (mm)} = (25.04 \times 0.58)/\text{display count} \quad (1)$$

Therefore, the substantial grain size of the abrasive grain of the count #2000 or more but #6000 or less in the present invention becomes 2.5 to $7.4 \times 10^{-3}$ mm.

Figure 1B:
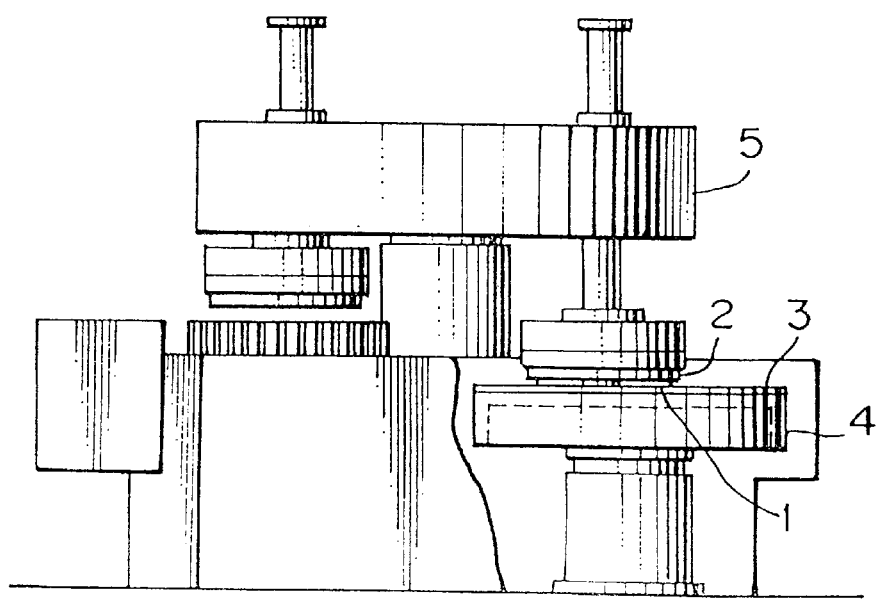
FIG. 1B shows an example of a side view, partly broken away, of the lapping machine used in the present invention.

The apparatus shown in FIGS. 1A and 1B is an example of the lapping apparatus used in the present invention.

In FIGS. 1A and 1B reference numeral 5 denotes a positioning table which rotates for every 90 degrees. In the position A, an absorber 2 absorbs and holds a plurality sheet of wafers 1. The wafer 1 is placed on a wafer waiting holder 8 by a loading arm 10 from a cassette accommodating mechanism 6, and thereafter the absorber 2 moves downward to hold the wafer 1 and enters the waiting mode.

Positions B and C are called the lapping positions. In these positions, the wafer 1 is vacuum-absorbed at its single surface by the wafer absorber 2 formed of a metal plate having a hole and is then rotated in the direction indicated by b and then pressed toward a surface plate 4 adhered by a ceramics plate 3 to rotate in the direction a. Thereby, the wafer is lapped by an abrasive agent slurry supplied to the upper surface of the ceramics plate 3.

An abrasive grain having a count of #2000 or more, and #6000 or less, is used to improve throughput in the positions B and C. The double-stage lapping is executed by using the abrasive grain having a rather low grain size of the count #2000 or more but #6000 or less in the position B and the abrasive grain having a comparatively high grain size in the position C.

The position D is provided to release the wafer 1 from the absorbing and holding condition to accommodate the wafer, for example, into the wafer cassette. The wafer 1 is once re-held into a collection holder 9 by means of the absorber 2, and thereafter the wafer is accommodated in the cassette of the cassette accommodating mechanism 7 by means of an unloading arm 11.

In the wet etching method, many sheets of wafer, for example, are set within a drum keeping a constant interval, these wafers are soaked into the known etching solution (for example, a mixed solution of hydrofluoric acid, nitric acid and acetyl) and these wafers are rotated to obtain the thickness of diffused layer having no oxide layer and execute the etching at each surface in view of obtaining the discrete wafer in a predetermined thickness.

The present invention provides the first effect in regard to the processing thickness accuracy that processing distortion by the grinding in the preceding process and scratch traces generated in the grinding process by a grind wheel can be perfectly eliminated. Thus, the lapping tolerance in this case is extremely shallow even when it is added with the next etching tolerance and thereby accuracy of wafer which is finished with the excellent thickness accuracy by the preceding surface grinding process can be maintained as it is. Accordingly, the bonding process with the wax, which has been indispensable in the existing final polishing to mirror surface, may be eliminated and thereby any defect resulting from bonding error and existence of foreign matter can be perfectly removed to provide the discrete wafer having excellent thickness accuracy.

Moreover, it is also possible, as the other methods only for the limited object of rejecting single side etching in regard to formation of an oxide film, to coat the single side of the wafer to be protected with wax or resist or to use a single side etching apparatus. The former method has a problem that the subsequent cleaning process of the wafer is considerably difficult and the latter method has a problem of diffusion of etching solution to the rear side. However, the mechanism for forming an oxide film of the present invention not only works as a perfect protection film because the dissolving rate (reaction rate) thereof for the ordinary etching solution is extremely smaller than that for the silicon semiconductor but also works as a protection wall for impurity in the various processes of the present invention.

Moreover, the means explained above also provides the effect as the discrete wafer that external diffusion of impurity from the side of formed diffused layer can be prevented in the next process, for example, in the formation of a new impurity diffused layer in the non-diffused layer side under the high temperature atmosphere and thereby the target effect (auto-doping) for influencing the diffusion impurity can also be eliminated.

The second effect is that productivity can be remarkably improved in regard to fabrication of the discrete wafer. Productivity of a single wafer of 125 mm ø is compared in Table 1, considering the number of wafers in batch process in the present invention and the related art method in the finishing process.

influences the cutting accuracy. The method [1] for cutting the wafers on the single wafer basis with the ID saw slicing machine assures the highest cutting accuracy among the three methods explained above because the wafer is held at the reference holding surface and the wafer is always cut at the constant tool position with respect to the reference surface.

The experimentally obtained cutting accuracy of the methods [1] and [2], when two hundred wafers are processed, will be indicated as follows, while the fluctuation of thickness (measured at the center of wafer and peripheral five points thereof is indicated as 3 σ (σ is the standard deviation).

Method [1] (single wafer method); 3 σ≈25 μm,
Method [2] (laminated wafer body method); 3 σ≈255 μm.

With reduction of fluctuation of thickness by cutting the wafer, on the single wafer basis, with the ID saw slicing machine, the grinding tolerance for the next grinding process can be set small, the grinding process with the grind

TABLE 1

|  | Processing rate in circumference direction | Tolerance in circumference direction | Required time for batch processing | Number of wafers for batch processing | Required time for a sheet of wafer |
|---|---|---|---|---|---|
| Related art |  |  |  |  |  |
| Method for polishing to mirror surface | 0.5 μm/min. | 8 μm | 16 min. | 20 | 0.8 min/sec |
| Present invention |  |  |  |  |  |
| Lapping process | 2 μm/min. | 2 μm | 1 min. | 10 | 0.1 |
| Etching process | 15 μm/min. | 4 μm | 0.27 min. | 125 | 0.002 |
| Total |  |  |  |  | 0.102 min/sec |

Productivity of the related art method and the present invention is compared from the required time for a sheet of wafer in Table 1. The result is:

Related art method:Present invention=1/0.8:1/0.102=1:7.8

It can be understood that productivity of the present invention in the finishing process can be improved up to 7.8 times that of the related art method.

The second aspect of the present invention will be explained.

The method for dividing the diffused wafer in which impurity is diffused in both surfaces into two pieces at the center of the wafer thickness can be classified into [1] the single wafer type slicing method in which a wafer is sliced one by one with the ID saw slicing machine and these wafers are collected, [2] wafers of the wafer laminated body are sequentially cut with the ID saw slicing machine and these wafers are collected at a time, and [3] the wafer laminated body is cut for the total number of wafers of the laminated body at a time with a wire saw. When considering the respective cutting systems from the viewpoint of the cutting accuracy, the method [3] is the best method for the productivity but does not perfectly establish the means for matching the wire with the center of each wafer thickness of many wafers and is therefore not sufficient for the cutting accuracy. The method [2] is rather simple because it can directly utilize the slicing machine of the related art but has a problem that fluctuation in fabrication of the laminated body wheel of the higher count #2000 or more but #6000 or less which reduces the grinding rate can be enabled, thereby the excellent processing surface, which assures lower processing distortion during the grinding process and provides extremely lower scratch traces during the grinding process, can be obtained, and processing distortion and scratch traces can be perfectly eliminated only by increasing the etching tolerance in the next etching process. Moreover, in this method, remarkable reduction of cost can be realized by eliminating the lapping process. Accordingly, this method can be said as the effective processing method depending on the application purpose of the discrete wafer.

The grinding wheel should have the count #2000 or more but #6000 or less. If the count is under #2000, processing distortion and surface roughness become large, resulting in a problem that a target excellent surface cannot be obtained after the etching process. If the count is #6000 or more, the surface after the etching process can be improved but the grain size of abrasives is further reduced as the grinding wheel has the higher count and the grinding process itself requires longer time, resulting in the problem that productivity is rapidly deteriorated. Here, the count means the display count and substantial grain size can be approximated from the formula (1) explained previously.

In a third aspect of the present invention, when the higher the count of the grinding wheel becomes, the smaller the grain size is and thereby the height of grain projected from the binder (mother material) is reduced and plugging of wheel and abrasion of the projected part of grain during the grinding process becomes remarkable, requiring more frequent dressing, namely removing of plugging and acquisition of height of projected part of grain (setting of grind wheel). The present invention includes a mechanism for executing the dressing by intentionally mixing air with the grinding water (including silicon semiconductor chips in the weight ratio of 0.01 to 0.05%) and then jetting continuously or intermittently, during the grinding process, this grinding water to the grinding wheel surface as a flow of water drops. Conditions such as flow rate of grinding water and mixing amount of air, etc. are set to obtain the amount of removal of the wheel per unit time which is equivalent to the known amount of abrasion of the grinding stone per unit time. Moreover, the fine silicon powder included in the grinding water may be used effectively and economically by utilizing the collected grinding water.

Figure 2:
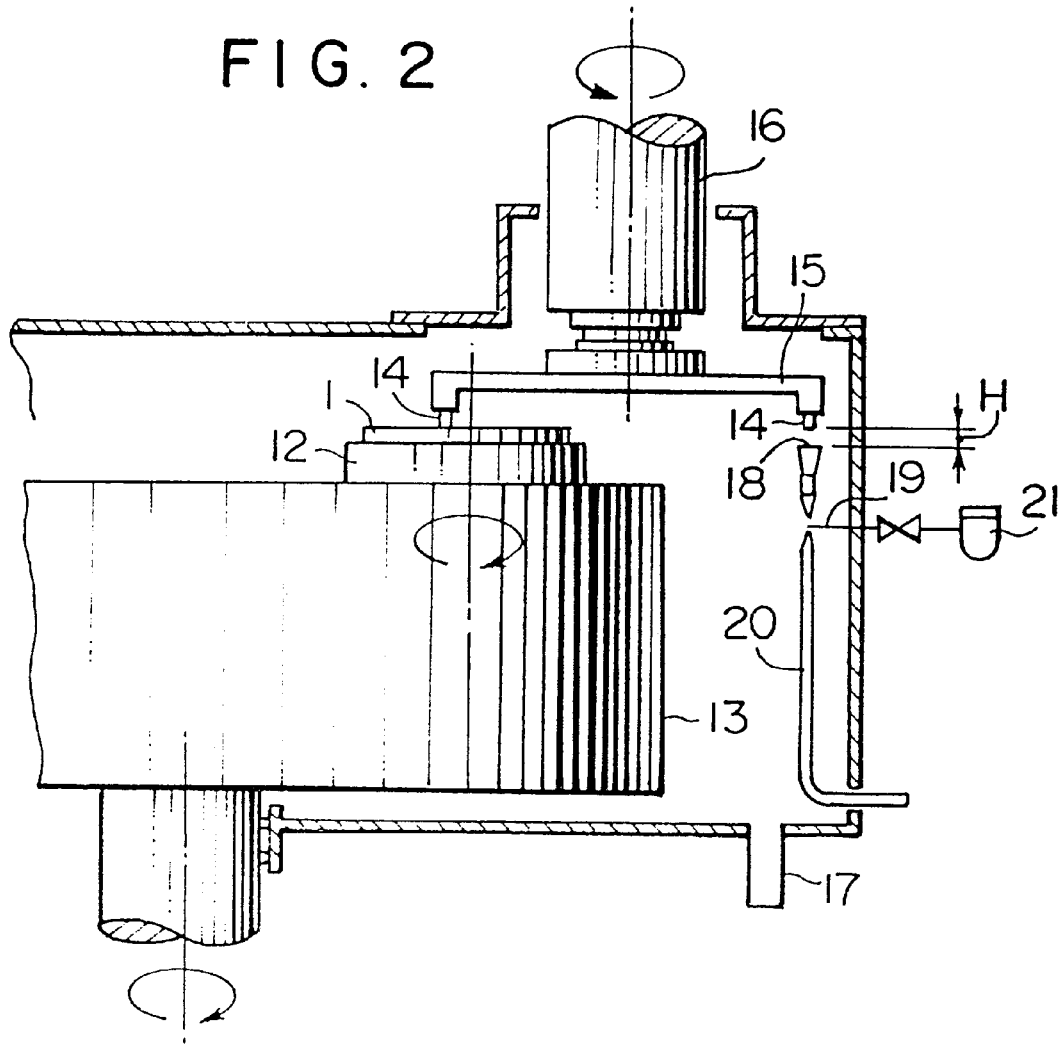
FIG. 2 shows a vertical cross-sectional view of the surface grinding machine providing the dressing device used in the present invention.

An example of the surface grinding machine including a dressing apparatus is shown in FIG. 2. In this figure, the wafer 1 to be ground is held by a vacuum chuck 12 and is comprised within the self-rotating mechanism provided in the rotatable work table 13. The wafer 1 is ground by the grinding wheel surface 14 of the grinding wheel 15 which rotates at a high speed. Reference numeral 17 denotes an exhaust port for collecting the grinding water. Large size silicon chips in the collected grinding water sink and are separated therefrom. Thereafter, the grinding water including silicon powder is jetted from a metal device 18 having the jet hole to jet the grinding water in the shape of a sector to cover the thickness of wheel in the radius direction to the grinding wheel surface 14 through the introducing pipe 20 at a pumping pressure, for example, of 17 kg/cm. In this case, since a narrow path (cross-sectional area is smaller than the jetting hole area) is provided before the metal device 18 having jetting hole of the introducing pipe 20 and the grinding water is always kept at the pressure lower than the atmospheric pressure without relation to the pumping pressure so long as it is flowing, air can easily be mixed with the grinding water through an air introducing pipe 19 and air flow regulating valve from a filter 21, and the grinding water can be jetted as a flow of fine water drops. Thereby, the distance H (between the jet hole and wheel surface), which is longer than the constant value required to obtain the flow of water drops, can be shortened to accurately determine the target area for the jetting. Here, it is also known that when binder strength of abrasive grains is rather strong and a larger amount of air is required to obtain the flow of fine water drops, a compressed air source (7 kg/cm$^2$) can be introduced, as is often widely used.

The effect of the second aspect of the present invention is that the single wafer type slicing method which has proved to have the highest slicing accuracy is introduced as the slicing system for cutting the wafer into two pieces. The result is to minimize the grinding tolerance of the next grinding process, and increase of time required for the grinding process due to rapid reduction of grinding speed because of use of the grinding wheel of the higher count (grinding wheel using finer abrasive grain) may be eliminated through minimization of the grinding tolerance, namely the grinding wheel of higher count (abrasive gain size #2000 or more but #6000 or less) can be used without ignoring the productivity. As a result, an excellent grinding surface can be obtained by reducing grinding distortion (for example, <1 μm) and scratch traces due to rotation of the grinding wheel for the grinding process (grinding traces of the fixed grinding wheel).

Therefore, only the tolerance of the etching process is increased to a certain degree but the processing distortion and grinding traces can be almost eliminated. As a result, the lapping process explained in the first aspect of the present invention can be eliminated for the discrete wafer, namely the discrete wafer which does not place the importance on the roughness (including the waving) of the surface, and thereby productivity can be improved to a large extent.

The third aspect of the present invention relates to a new dressing method which has been proposed to overcome the problem that the grinding wheel of higher count which is used as an object of the second aspect of the present invention often generates plugging because the height of projected grain is rather low. Therefore, dressing is required too frequently to execute the practical use by manually stopping the grinding process. In this method, the grinding water used for the grinding process is collected (the collected water includes fine powder chips of silicon generated during the grinding process), and the collected water is then jetted to the grinding wheel surface from a nozzle for the purpose of dressing. However, in this case, air is taken from an air inlet port provided near the end of the nozzle and is then mixed with the grinding water, and thereby the injected flow of the grinding water is jetted to the surface of the rotating grinding wheel as a flow of fine water drops. The air can be taken easily because the air inlet pipe is connected to a narrow path provided near the end of the nozzle and the water pressure in this narrow path is always kept under the atmospheric pressure without relation to the water pressure. Moreover, although silicon powder is included in the collected grinding water, the amount of silicon is a very little in weight. Thus, the silicon powder has only a little influence, and a benefit in cost can be considered in the recycle use of the collected grinding water. Furthermore, an external force applied to the grinding wheel surface can be obtained from the striking force of every drop of water in the flow of water drops, which can be described as a repeated load which is often repeated within a short period of time when considering it in addition to the rotation of the grinding wheel. Thereby, not only the plugging of the grinding wheel surface due to the silicon powder can be removed but also the binder (mother material) of the grain can be broken from the surface due to fatigue failure, depending on the preset conditions. Therefore, since the projected height of the grains from the mother material can be kept effectively constant by using the injected flow of fine water drops, namely with a smaller amount of injected flow of water drops (with a lower jetting pressure), this method may be used as an alternative to the manual dressing (removal of plugging and setting of wheel) of the related art. The assumed reason is that, based on the phenomenon that the theoretical data for object removal (amount of object to be removed) at the surface when a high speed flow of solution is jetted thereto proves flow rate of solution becomes maximum immediately after the end of the nozzle to provide the maximum force. However, the actually measured value shows that almost nothing is removed near the end of nozzle but when the distance from the end of the nozzle is increased, the amount of object to be removed is linearly increased and thereafter it becomes constant and then gradually decreased. The flow of water drops at a higher flow rate and is formed of finer water drops due to the friction with water when the distance from the end of the nozzle is increased up to the constant distance resulting in weak striking force of each water drop. However, in the case of the mother material of grinding wheel, which does not show the definitive limit of fatigue failure in the S-N curve, showing the relationship between the amplitude of stress and life for fatigue, fatigue failure is considered to progress due to increase in number of times of repetition of the repetitive load.

EXAMPLE 1

In the case of fabricating a discrete wafer in the thickness of 250 μm formed of a non-diffused layer of 100 μm and a diffused layer of 150 μm as a complete product, the wafer is cut into two pieces at the center of the thickness with an ID saw slicing machine. A diffused layer of 154 μm is formed on both sides of the wafer of 1100 μm considering the final discrete wafer of 8 μm from both surfaces, 100 sheets of these wafers are respectively coated with a wax and are then placed vertically in the conduit type bath and are then pressurized for bonding at a right angle with high accuracy from both ends of wafer under the high temperature atmosphere. The wafers are then cooled to form an ingot type laminated body (this embodiment is aided to 100 sheets of wafers in order to avoid missing of wafer due to the cutting accuracy and cutting resistance during the cutting process). Thereafter, each wafer is cut at the center of thickness from the first wafer from this laminated body with an ID saw slicing machine. Ultimately, 200 sheets of wafers are obtained, and the wax used for the bonding is dissolved for removal. The target thickness of the cutting process is 385 μm when the thickness of grinding surface is 330 μm. Next, the cutting surface of the wafer is ground with a two-axis grinder. For the first axis, the grinding wheel of the count #400 is used and for the second axis, the grinding wheel of the count #2000 is used. The target thickness of the grinding process is set to 260 μm. Next, the lapping apparatus shown in FIG. 1 is caused to vacuum-absorb the wafer 1 one by one to perform the lapping process by pressing against the ceramic board attached to the rotating surface plate using the abrasive grain of #3000. The processing distortion in the preceding grinding process can be assumed as <1 μm and the target lapping tolerance is 2 μm. Next, the wafers are placed in the drum in a plurality of sheets in the constant interval and are then soaked in the etching solution (including hydrofluoric acid of 50 wt %, nitric acid of 70 wt % and acetyl of 99 wt % mixed in the volume ratio of 1:4:2) and then rotated. When the etching rate is equal (the etching rate of the diffused layer surface is delicately different from that of the non-diffused layer surface because impurity is usually doped in high concentration), the diffused layer surface and non-diffused layer surface are respectively etched in the thickness of 4 μm. Thereby, the discrete wafer in the target thickness of 250 μm including the impurity diffused layer of 150 μm and non-diffused layer of 100 μm can be obtained.

The average thickness of the discrete wafers of 200 sheets fabricated actually has been 250.3 μm with fluctuation 3 σ of 4.35.

Comparative Example 1

In the case of fabricating a discrete substrate in the thickness of 250 μm including the non-diffused layer of 100 μm and the diffused layer of 150 μm as a complete product, the diffused layer of 150 μm is formed from both sides of the wafer in the thickness of 445 μm, the single surface is ground by the grinding process up to the target thickness of 258 μm to perfectly remove the diffused layer at the single surface and leave a part of the non-diffused layer. Next, as the final finishing process, the wafer is bonded to a glass plate using the wax by the regular method and the grinding surface is polished up to the mirror surface until the target thickness of 250 μm.

The average thickness of the discrete wafer of 200 sheets fabricated actually has been 250.8 μm with fluctuation 3 σ of 7.08.

Comparative Example 2

In the case of fabricating a discrete substrate in the thickness of 250 μm including the non-diffused layer of 100 μm and the diffused layer of 150 μm as a complete product, the diffused layer of 150 μm is formed from both surfaces of the wafer in the thickness of 1100 μm, the wafers of 100 sheets are respectively coated with the wax to form the laminated body as in the case of example 1. Thereafter, each wafer is cut sequentially at the center of thickness from the first one of the laminated body using the ID saw slicing machine. Ultimately, 200 sheets of wafers are collected, and the wax used for bonding is removed with a solvent. The target thickness of the cutting process is set to 385 μm when the thickness of the grinding wheel is 330 μm. Next, the cutting surface of the wafer is ground with a two-axis grinder. For the first axis, the grinding wheel of count #400 is used, while for the second axis, the grinding wheel of count #2000 is used. The target thickness in the grinding process is set to 258 μm. Next, as the finishing process, the wafer is bonded to the glass plate using the wax and is then polished up to the mirror surface by the regular method.

The average thickness of the discrete wafer of 200 sheets fabricated actually has been set to 250.6 μm with fluctuation 3 σ of 6.55.

EXAMPLE 2

In the case of fabricating a discrete wafer in the thickness of 250 μm including the non-diffused layer of 100 μm and the non-diffused layer of 150 μm as the complete product from the starting material of wafer in the thickness of 1100 μm, a starting material to which the diffused layer of 150 μm is formed from both sides and an oxide film is further formed on the surface in the thickness of 1.7 μm (hereinafter the oxide film is ignored). The wafers of 100 sheets as the starting material are laminated as in the case of Example 1, and each wafer is cut sequentially at the center of the thickness from the first one with the ID saw slicing machine until 200 sheets of wafers can be obtained in the target thickness of cutting of 385 μm. The wafer is ground in the target grinding thickness of 256 μm as in the case of Example 1, and the wafer is then lapped in the target thickness of 254 μm and thereafter etched. Here, the wafer thickness after the lapping process is 254 μm, and it has been etched in the drum which is rotated in the etching solution until the target thickness of 250 μm is reached. In this case, the oxide film in the diffused layer side is etched only by 0.35 μm, leaving the diffused layer nonetched, but only the lapped surface has been etched in the thickness of 4 μm. Thereby, the discrete wafer having the diffused layer of finished thickness of 150 μm, oxide film at the outside of diffused layer of 1.35 μm and non-diffused layer of 100 μm has been obtained.

The finally existing oxide film of 1.35 μm is of sufficient thickness for preventing auto-doping in the next process.

The average thickness of the discrete wafer of 200 sheets fabricated in actual has been 250.7 μm with fluctuation 3 σ of 3.73.

EXAMPLE 3

In the case of fabricating a discrete wafer in the thickness of 250 μm including the non-diffused layer of 100 μm and the diffused layer of 150 μm as the complete product from starting material in the thickness of 980 μm, the diffused layer of 150 μm is formed on both surfaces of the starting material wafer and moreover an oxide film of 1.7 μm is formed thereon.

This wafer is cut, one by one on the single wafer basis, into two pieces at the center of the thickness with the ID saw slicing machine and these two wafers are collected repeatedly (the target thickness is 325 μm except for the thickness of oxide film) until 200 sheets of wafers can be obtained. Next, these wafers are ground with the grinding wheel of the two-axis surface grinding machine including the dressing device shown in FIG. 2. The grinding wheel in the abrasive grain of #800 is used for the first axis, while the grinding wheel in the abrasive grain of #4000 is used for the second axis (the target thickness is 265 μm except for the thickness of oxide film). Thereafter, the single surface of this wafer is etched to a depth of 15 μm with the etching solution as in the case of Example 1. In this case, etching has been advanced by 15 μm only on the non-diffused layer but on the diffused layer, showing reduction in the thickness of the oxide film of 1.7 μm to 1.3 μm. Accordingly, the wafer fabricated has the total thickness of 250 μm (except for the thickness of oxide film) including the diffused layer in the thickness of 150 μm, the oxide film formed thereon in the thickness of 1.3 μm and the non-diffused layer in the opposite side in the thickness of 100 μm.

Here, the etching tolerance becomes rather deeper than that in Examples 1 and 2 because the grinding process before the etching is executed using the grinding wheel of the count #4000 resulting in extremely lesser grinding distortion (<0.5 μm) but the remaining scratch traces of the grinding wheel generated in the grinding process must be eliminated perfectly with increase of the etching tolerance.

Moreover, any plugging has not been generated even when the grinding wheel of higher count is used for the surface grinding machine.

The average thickness of 200 sheets of discrete wafers fabricated actually has been 250.3 μm with fluctuation 3 σ of 2.82.

According to the first embodiment of the invention, wafers having excellent finishing accuracy can be fabricated and the fabrication cost can also be reduced by introducing the etching process having good productivity for the final polishing process. Moreover, according to the second embodiment of the invention, the lapping process before the etching process can be eliminated to realize further cost reduction and according to the third embodiment of the invention, the dressing device has much improved a net working rate of the grinding machine in order to remarkably improve the productivity.

Having described specific preferred embodiments of the invention with reference to the accompanying drawings, it will be appreciated that the present invention is not limited to those precise embodiments, and that various changes and modifications can be effected therein by one of ordinary skill in the art without departing from the scope and spirit of the invention as defined by the appended claims.

What is claimed is:

1. A method of dressing a grinding wheel surface for fabricating silicon semiconductor discrete wafers, the grinding wheel performing a grinding process, the method comprising:

collecting grinding water including silicon semiconductor chips, during the grinding process of a silicon semiconductor wafer with a grinding wheel having a count of no less than #2000 and no greater than #6000;

mixing air into the grinding water; and jetting the mixed water and air as a group of minute water drops to the grinding wheel surface during the grinding process to dress the grinding wheel surface.

2. The method of fabricating a silicon semiconductor discrete wafer employing the grinding wheel dressed according to claim 1, the method comprising:

cutting a diffused wafer into two pieces at a center of the wafer thickness, each piece having an impurity diffused layer at one side and an impurity non-diffused layer at a cutting surface on another side thereof, grinding both cutting surfaces with an abrasive grain having a count of no less than #2000 and no greater than #6000; and wet etching both ground surfaces, both wet etched surfaces being completed by the wet etching.

3. The method of fabricating a silicon semiconductor discrete wafer employing the grinding wheel dressed according to claim 1, the method comprising:

cutting a diffused wafer into two pieces at a center of the wafer thickness, each piece having an impurity diffused layer at one side and an impurity non-diffused layer at a cutting surface on another side thereof;

grinding both cutting surfaces to a predetermined thickness;

lapping both cutting surfaces with an abrasive grain having a count of no less than #2000 and no greater than #6000, and wet etching both lapped surfaces, both wet etched surfaces being completed by the wet etching.

4. The method of dressing a grinding wheel surface according to claim 1, wherein the mixing of air into the grinding water comprises mixing air at a pressure of not greater than atmospheric pressure into the grinding water.

5. The method of dressing a grinding wheel surface according to claim 1, the collecting, mixing and jetting being performed during a grinding process.

6. The method of fabricating silicon semiconductor discrete wafer according to claim 2, wherein said diffused wafer includes an oxide film formed on both surfaces of the impurity diffused layer, so that each impurity diffused layer of the two pieces is covered with an oxide film after said cutting and before said grinding.

7. The method of fabricating silicon semiconductor discrete wafer according to claim 2, wherein said cutting of the diffused layer is carried out by an ID saw slicing machine.

8. The method of fabricating silicon semiconductor discrete wafer according to claim 2, wherein said grinding is carried out by a surface grinding machine.

9. The method of fabricating silicon semiconductor discrete wafer according to claim 3, wherein said diffused wafer includes an oxide film formed on both surfaces of the impurity diffused layer, so that each impurity diffused layer of the two pieces is covered with an oxide film after said cutting and before said grinding.

10. The method of fabricating silicon semiconductor discrete wafer according to claim 3, wherein said cutting is carried out with an ID saw slicing machine.

11. An apparatus for dressing a surface of a grinding wheel, comprising:

a pipe that provides grinding water including silicon semiconductor chips ground by a grinding wheel having a count of no less than #2000 and no greater than #6000 during a grinding process;

an air introducing pipe that mixes air into said grinding water; and a nozzle that jets the mixed water and air as a group of minute water drops onto the grinding wheel surface during the grinding process to dress the grinding wheel surface.

12. An apparatus for dressing a surface of a grinding wheel according to claim 11, wherein the grinding water is supplied to the pipe under pressure.

13. An apparatus for dressing a surface of a grinding wheel according to claim 11, wherein said air introducing pipe includes an air flow regulating valve.

14. An apparatus for dressing a surface of a grinding wheel according to claim 13, wherein said air introducing pipe includes a filter.

15. The apparatus for dressing a surface of a grinding wheel according to claim 11, wherein said air introducing pipe introduces air at a pressure not greater than atmospheric pressure into the grinding water.

16. The apparatus for dressing a surface of a grinding wheel according to claim 11, further comprising a grinding apparatus including a grinding wheel that performs a grinding process concurrently with the dressing of the grinding wheel surface.

* * * * *